(12) United States Patent
Pinna

(10) Patent No.: US 6,380,878 B1
(45) Date of Patent: Apr. 30, 2002

(54) DIGITAL-TO-ANALOG CONVERSION CIRCUIT

(75) Inventor: Carlo Pinna, Sassari (IT)

(73) Assignee: STMicroelectronics, s.k.l, Agrate Brianza (IT)

( * ) Notice: Subject to any disclaimer, the term of this patent is extended or adjusted under 35 U.S.C. 154(b) by 0 days.

(21) Appl. No.: 09/920,445

(22) Filed: Aug. 1, 2001

(30) Foreign Application Priority Data

Aug. 10, 2000 (EP) .............................. 00830573

(51) Int. Cl.$^7$ ................................ H03M 1/78
(52) U.S. Cl. .................. 341/154; 341/144; 341/146; 341/147; 341/120; 341/143
(58) Field of Search .................. 341/154, 143, 341/144, 146, 147, 120

(56) References Cited

U.S. PATENT DOCUMENTS

| | | | | |
|---|---|---|---|---|
| 3,721,975 A | * | 3/1973 | Brinkman et al. | 341/156 |
| 4,703,310 A | * | 10/1987 | Van De Plassche | 341/144 |
| 4,791,406 A | * | 12/1988 | Mehrgardt et al. | 341/144 |
| 4,868,572 A | | 9/1989 | Reiber | 341/145 |
| 5,138,317 A | * | 8/1992 | Story | 341/144 |
| 5,221,926 A | * | 6/1993 | Jackson | 341/118 |
| 5,305,004 A | * | 4/1994 | Fattaruso | 341/120 |
| 5,404,142 A | * | 4/1995 | Adams et al. | 341/144 |
| 6,124,813 A | * | 9/2000 | Robertson et al. | 341/143 |

FOREIGN PATENT DOCUMENTS

| EP | 0 982 864 | 11/1999 |
|---|---|---|
| GB | 2 296 398 | 12/1994 |

OTHER PUBLICATIONS

Radke, et al., LSI Logic, Ft. Collins and School of Electrical Engineering & Computer Science, Washington State University, Pullman, "A Spurious–Free Delta–Sigma DAC Using Rotated Data Weighted Averaging", 1999 IEEE, pp. 125–128.

* cited by examiner

Primary Examiner—Michael Tokar
Assistant Examiner—Lam T Mai
(74) Attorney, Agent, or Firm—Hogan & Hartson, LLP

(57) ABSTRACT

The present invention refers to a digital to analog conversion circuit able to transform an input digital signal having n bit in a signal having a thermometric code and to convert it in an analog output signal. In an embodiment the digital to analog conversion circuit able to transform a digital input signal having n bit in an output analog signal comprise: a thermometric decoder having said digital input signal in input and able to produce said signal having a thermometric code with $2^n-1$ bit in output; a digital to analog converter with modular elements including $2^n-1$ controlled switches; a shift register able to receive said digital signal having $2^n-1$ bit in an data input and able to produce $2^n-1$ control signals of said controlled switches in output; a delay circuit of said of digital input signal having the output connected to a shift input of said shift register and able to produce a delayed digital signal in output as to make said digital signal having $2^n-1$ bit shift by a number of bit equal to the value of said delayed digital signal; characterized by further comprising a generator of a digital random number selected in a range of prefixed values and having a prefixed probability of occurrence; an adder node able to receive said random digital number and said delayed digital signal in input whose output is connected to said shift input of said shift register.

11 Claims, 5 Drawing Sheets

DIGITAL-TO-ANALOG CONVERSION CIRCUIT

The present invention refers to a digital to analog conversion circuit able to transform an input digital signal having n bit in a signal having a thermometric code and to convert it in an analog output signal. It also refers to a digital to analog conversion method of the type above mentioned, and to a digital to analog converter comprising a sigma delta modulator and a digital to analog conversion circuit of the type above mentioned.

In the realisation of a digital to analog converter (DAC) realised with modular elements, for instance capacitive, there are some problems related to the physical realisation of the circuit that limit the performances particularly for what concerns the linearity. For example the converters with capacitive elements are based on the modularity of the elements (capacitors) and on the mutual precision (matching) of the modules. The precision with which the capacitive elements could be realised is related prevalently to the characteristics of the technology, therefore, having fixed the capacitor value of the single module, usually it is not possible to overcome the intrinsic limit of the technology in the general performances of the converter.

In the case of oversampled DAC converters, that is the frequency range f in which the signal is comprised is smaller than half of the sampling frequency fs/2 at least of a factor two, particularly when the oversampling relationship OSR=(fs/2)/f overcomes some units, there are some techniques to reduce the process tolerance effect of the capacitors in the frequency interval f of the signal. A technique is that which uses a mixing circuit (scrambler) that performs this function through the mixing of the use of capacitive elements. Particularly, one among the mixing techniques foresees that the capacitors, through which the conversion is effected, are used in a cyclical way. With this technique the noise introduced by the capacitors tolerances is moved prevalently to high frequency and the converter becomes more linear. The mixing technique described presents sure advantages, but it has a problem that in the practise has limited the use strongly, that is the presence of tones (lines in the converter error spectrum) which show in a particularly evident way in presence of a constant or very small input signal.

In the U.S. Pat. No. 5,404,142 is described a more stadiums mixer circuit with cells that connect directly or to the opposite the inputs and the outputs. This solution has not the tone problem, but it is based on a very complex architecture that grows with the increase of the number of used bits and it is however limited to applications with a number of modular elements that are a power of two.

In the article by R. Radke, A. Eshraghi, T. Fiez "A Spurious Free Delta Sigma DAC Using Rotated Data Weighted Averaging," Proceedings of the IEEE 1999 CICC, Pag. 125–128, a rotation technique of the use of the modular elements is used which changes the sequence occasionally by means of a graph that represents the possible sequences. It succeeds in obviating to the tone problem, but the authors state that applying their solution to converters with more levels causes an unimaginable complexity. For example with 8 levels (3 bit) there are 5040 possibilities.

In view of the state of the art described, an object of the present invention is that of obtaining a digital to analog conversion circuit able to transform a digital input signal having n bit in a signal having a thermometric code and to convert it in an analog output signal that has the lowest possible noise in the signal band.

Another object is that of reducing if not eliminating the tone presence, that is the lines in the output signal spectrum.

A further object is that of obtaining a circuit having a reduced complexity, such as to avoid a meaningful impact on the dimensions for its realisation.

In accordance to the present invention, these and other objects are reached by means of a digital to analog conversion circuit able to transform a digital input signal having n bit in an analog output signal comprising: a thermometric decoder having said digital input signal in input and able to produce said signal having a thermometric code with $2^n-1$ bit in output; a digital to analog converter with modular elements including $2^n-1$ controlled switches; a shift register able to receive said digital signal having $2^n-1$ bit in a data input and able to produce $2^n-1$ control signals of said controlled switches in output; a delay circuit of said input digital signal having the output connected to a shift input of said shift register and able to produce a delayed digital signal in output in order to make said digital signal having $2^n-1$ bit shift of a number of bit equal to the value of said delayed digital signal; characterised by further comprising a generator of a digital random number selected in a range of prefixed values and having a prefixed probability of occurrence; an adder node able to receive said random digital number and said delayed digital signal in input whose output is connected to said shift input of said shift register.

Such objects are furthermore reached by means of an analog digital conversion method able to transform an input digital signal having words of n bit in an analog output signal comprising the following phases: transforming said input words in words having a thermometric code; applying said words having a thermometric code to a shift register; providing the words coming from said shift register to a digital to analog converter with modular elements; making the words contained in said register shift by a value equal to the preceding word; characterised by comprising the phase of making the words contained in said register shift by a further prefixed value on times with a prefixed probability.

Such objects are also reached by means of a method of digital to analog conversion of a digital input signal having a thermometric code in an analog signal, said input signal is constituted by a first digital word and by a second digital word in succession to said first digital word, comprising the following phases: adding said first and said second digital word; applying said sum as input signal of a digital to analog converter with modular elements; characterised in that the phase of adding said first and said second digital word comprises also the phase of adding a random digital number selected in a prefixed range values and having a prefixed occurrence probability.

Furthermore they are reached by means of a digital to analog converter comprising a sigma delta modulator and a digital to analog conversion circuit in accordance with the claim 1.

Thanks to the present invention it is possible to realise a circuit whose complexity does not grow with the increasing of the converter level number and therefore it is usable also in DAC with an elevated number of bit.

The characteristics and the advantages of the present invention will result evident from the following detailed description of its embodiment, illustrated as non limitative example in the enclosed drawings, in which.

Figure 1:
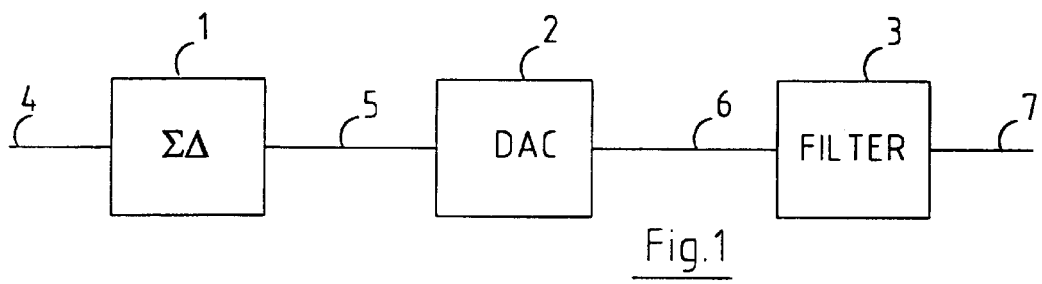
FIG. 1 shows a digital to analog converter comprising a sigma delta modulator.

FIG. 1 shows a general block scheme of a digital to analog converter comprising a sigma delta modulator 1, which receives a digital signal 4 in input, the signal 5 coming from the sigma delta modulator 1 is applied to a digital to analog converter 2. The analog signal 6 coming from the digital to analog converter 2 is applied to a levelling low pass filter 3 which produces an output signal 7.

The digital to analog converter 2, according to the known art, comprises a D/A converter with capacitive elements and a circuit able to transform a digital input signal in a signal having a thermometric code.

Figure 2:
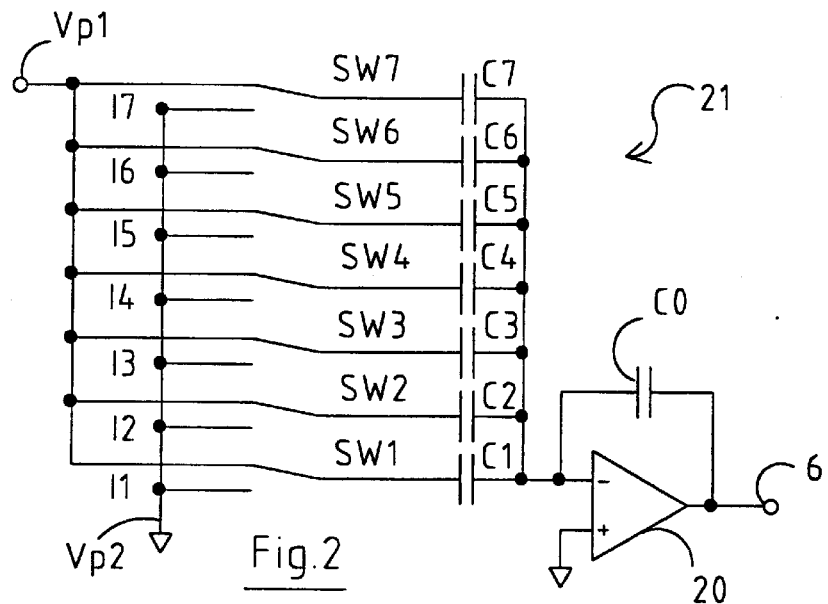
FIG. 2 shows an exemplifying scheme of a D/A converter with capacitive elements.

In FIG. 2 is shown an exemplifying scheme of a D/A converter with capacitive elements 21. It comprises, considering for instance a converter having a thermometric code with 8 levels, 7 capacitors C1–C7 having a terminal of each of them connected together and applied to the inverting input of an operational amplifier 20, the non-inverting input is connected to ground and between the output (on which there is the analog signal 6) and the inverting input is applied a capacitor C0. The capacitors C1–C7 are connected in series to 7 switches I1–I7 controlled by the signals SW1–SW7 coming from a circuit able to transform a digital input signal in a signal having a thermometric code described subsequently. The switches I1–I7 connect selectively, on control of the signals SW1–SW7, the capacitors C1–C7 or to a first prefixed bias voltage. Vp1 or to a second prefixed bias voltage Vp2, that in the example of FIG. 2 corresponds to ground.

Figure 3:
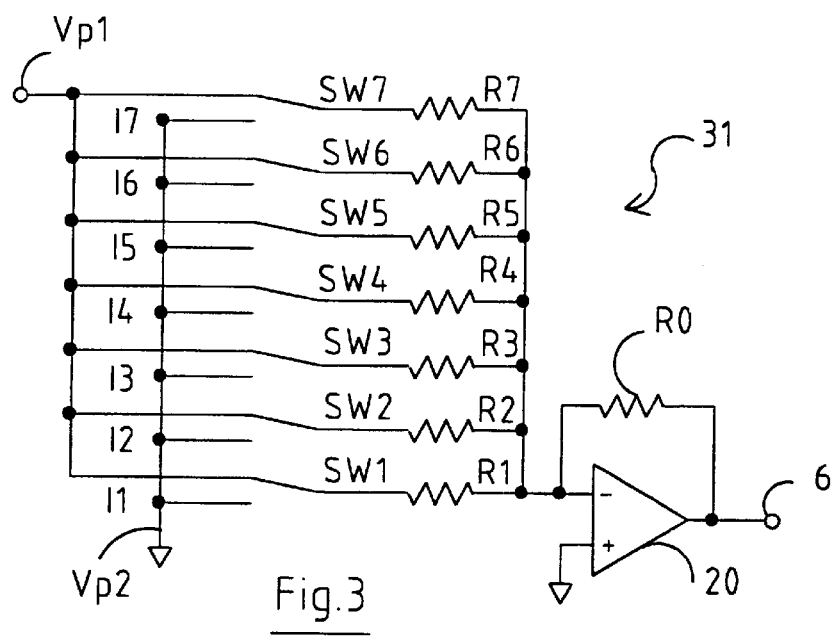
FIG. 3 shows an exemplifying scheme of a D/A converter with resistive elements.

FIG. 3 shows an exemplifying scheme of a D/A converter with resistive elements 31 which can be used in alternative to the circuit of FIG. 2. It corresponds to the circuit 21 of FIG. 2 with the exception that the capacitors C0–C7 have been replaced by the resistances R0–R7, the other corresponding elements have the same identifying references.

Figure 4:
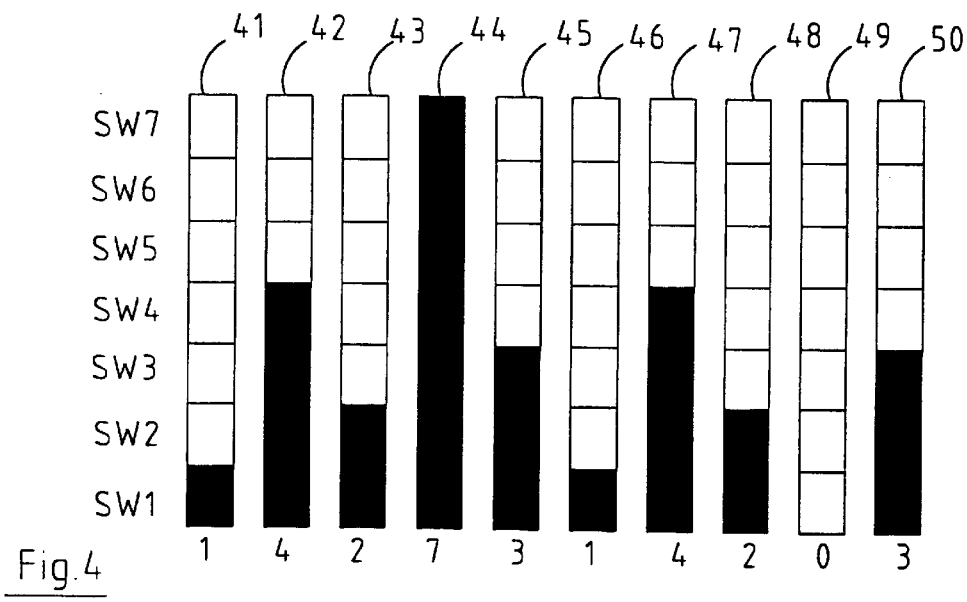
FIG. 4 shows an exemplifying scheme of the use of the capacitors of a D/A converter of FIG. 2.

FIG. 4 shows an exemplifying scheme of the capacitors use of the D/A converter 21 of FIG. 2 according to the known art. In FIG. 4 are reported 10 columns 41–50 of 7 elements which represent 10 examples of digital values with 8 levels having thermometric code that in our example correspond to the signals SW1–SW7 of the control switches I1–I7 and they therefore represent the capacitors C1–C7 used for the conversion. Particularly the numbers reported under the columns 41–50 correspond to the digital values to be converted and the elements in dark colour represent the capacitors used for the conversion. Therefore if n is the value to be converted the first n capacitors are used.

Figure 5:
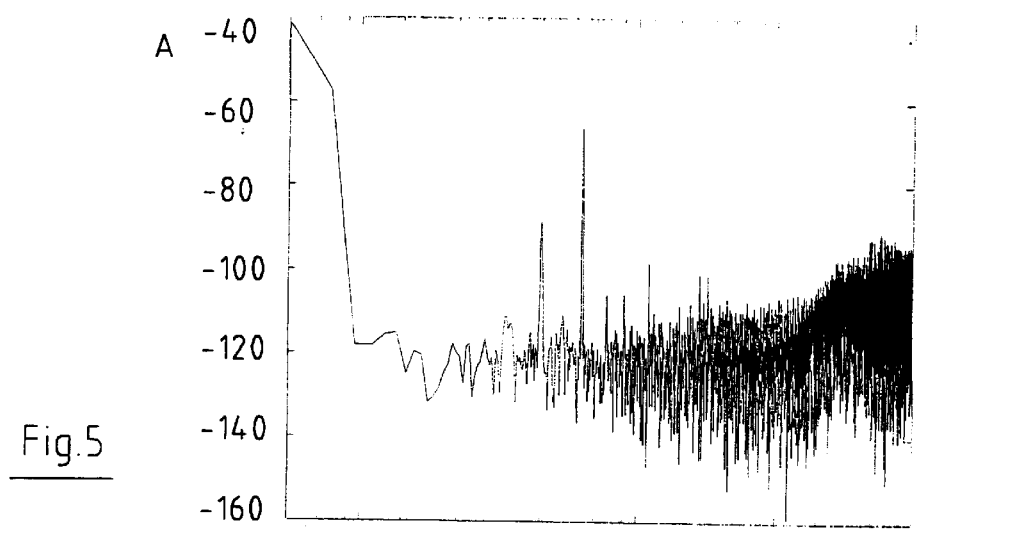
FIG. 5 shows a graph in frequency of the converter error of FIG. 2 in presence of the signal.

In FIG. 5 can be seen the result of a simulation of a D/A converter 21 with capacitive elements having a prefixed process tolerance, having for instance a distribution with a σ of 1%. On the abscissa the frequency f is reported and on the ordinate the amplitude A of the spectrum is reported, and the applied signal is a 20 Hz sinusoid with an amplitude equal to −10 dB. Particularly it is shown the spectrum of the difference between the real analog voltage (generated by elements with a prefixed process tolerance) and the ideal one (generated by the elements which do not present tolerance), that is it corresponds to the noise due to the tolerances in the values of the single capacitor. The lines or tones which can be seen in the graph are an effect of the non linearity.

Figure 6:
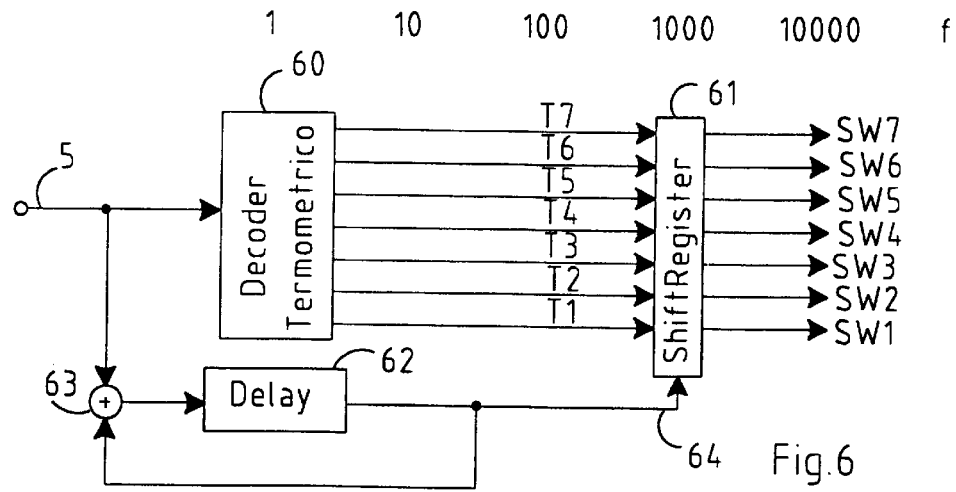
FIG. 6 shows a block scheme of a circuit able to transform an input digital signal in a signal having a thermometric code in accordance to the known art.

We refer now to FIG. 6, that shows a block scheme of a circuit able to transform an input digital signal 5 in a signal having a thermometric code according to the known art. The signal 5 coming from the sigma delta modulator 1, that for example has 3 bit is applied, preferably in a parallel way on three separated lines, to a thermometric decoder 60, which produces the signals T1–T7 in output on 7 lines which have a thermometric code (8 levels) corresponding to the word (having 3 bit) present in input. The thermometric decoder 60 is not further described as well known by the technician of the field. The signals T1–T7 are applied to the input of a shift register 61 which produces the output signals SW1–SW7 which are used like controls of the switches of the D/A converter 21 with capacitive elements of FIG. 2. The signal 5 is also applied to an adder node 63, the output of the adder node 63 is connected to a delay circuit 62. The delay output circuit 62 is applied to a shift input 64 of the shift register 61 and to a further input of the adder node 63.

The circuit of FIG. 6 uses the mixing technique that foresees to use the capacitors, through which the conversion is effected, in a cyclical way.

Figure 7:
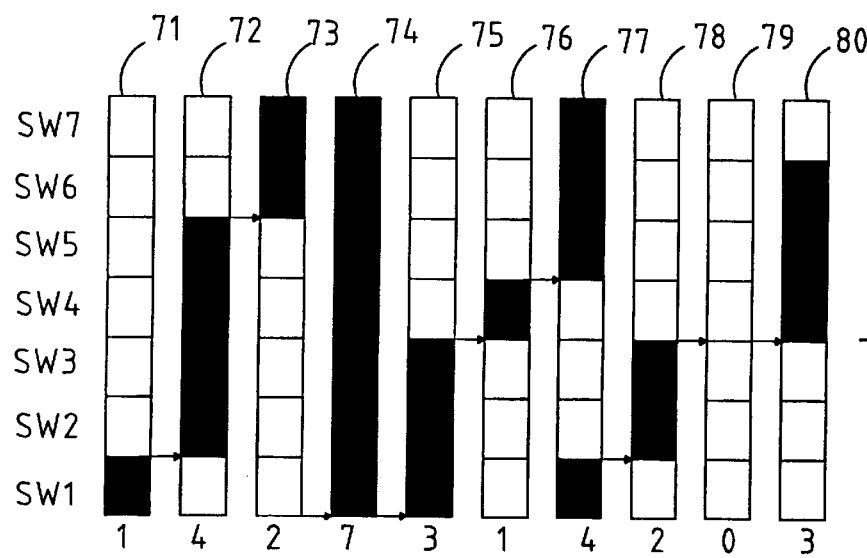
FIG. 7 shows an exemplifying scheme of the use of capacitors of a D/A converter of FIG. 2 with the control circuit of FIG. 6.

With FIG. 7, analogous to FIG. 4, we see the capacitors of the D/A converter 21 of FIG. 2 with the control circuit of FIG. 6. In fact it is possible to see that if n is the value to be converted the first n capacitors are not used, but they are shifted cyclically. It is to start to use the capacitor following the last one previously used, and at the filling of the shift register 61 it is to continue from the beginning of the same.

The delay circuit 62 and the adder node 63 operate so that the values of the word present in the shift register 61 are shifted by a value equal to the value of the preceding word. With this technique the noise introduced by the capacitor process tolerances is moved in high frequency prevalently out of the signal band, and the D/A converter 21 becomes more linear. This technique presents sure advantages, but it has a problem that has strongly limited the use in the practice that is the tone presence (lines in the spectrum) that show in a particularly evident way in presence of a constant or very small input signal. In fact the result of an analogous simulation to that shown in FIG. 5 (20 Hz sinusoid and amplitude −10 dB) could be seen in FIG. 8, but with a control circuit like that of FIG. 6, and in FIG. 9 another simulation, always with a control circuit like that of FIG. 6, but with a 20 Hz sinusoidal signal applied and amplitude equal to −90 dB. It is to be noticed in fact, in particular with low input signals a notable presence of tones.

Figure 10:
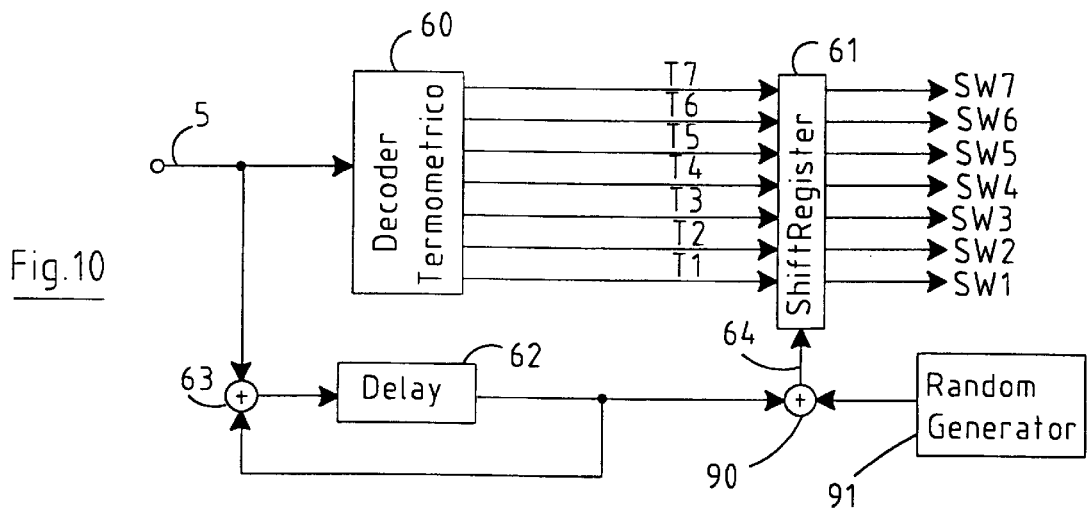
FIG. 10 shows a block scheme of a circuit able to transform a digital input signal in a signal having a thermometric code in accordance to the present invention.

It is to be noted now, in FIG. 10, a block scheme of a circuit able to transform an input digital signal in a signal having a thermometric code according to the present invention.

It distinguishes itself from that reported in FIG. 6 for the addition of an adder node 90 and of random number generator 91. Particularly the delay circuit 62 output is not applied directly to the shift input 64 of the shift register 61 but to an adder knot 90, whose output is connected to the shift input 64. The output of the random number generator 91 is applied to a further adder node 90 input.

Figure 11:
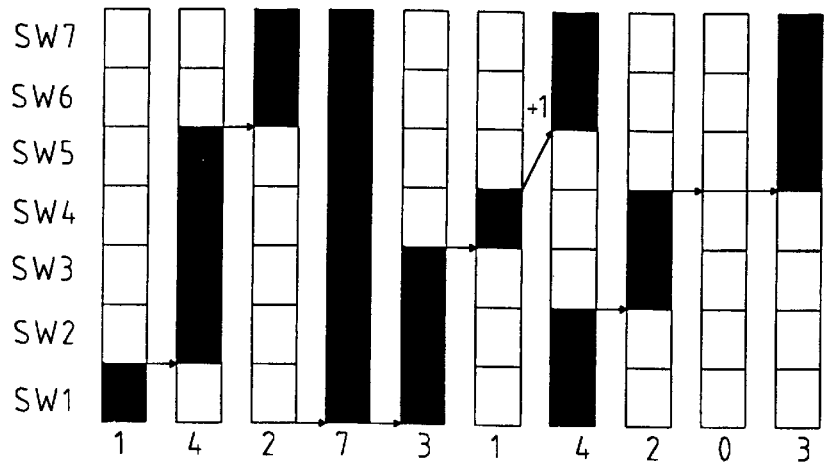
FIG. 11 shows an exemplifying scheme of the use of the capacitors of a D/A converter of FIG. 2 with the control circuit of FIG. 10 in accordance to the present invention.

With FIG. 11, analogous to the FIGS. 4 and 7, it is possible to see how the capacitors of the D/A converter 21 of FIG. 2 are used with the control circuit of FIG. 10. To note that the capacitors are cyclically shifted as in the case of FIG. 7 but the generator 91 generates the value 1 which is added to the value going out from the delay circuit 62 with a prefixed probability and it therefore makes the cyclical shift jump given by the delay circuit 62. The result is a spectrum substantially flat with the absence of tones also with a low input signals as it could be seen in FIGS. 12 and 13.

Figure 8:
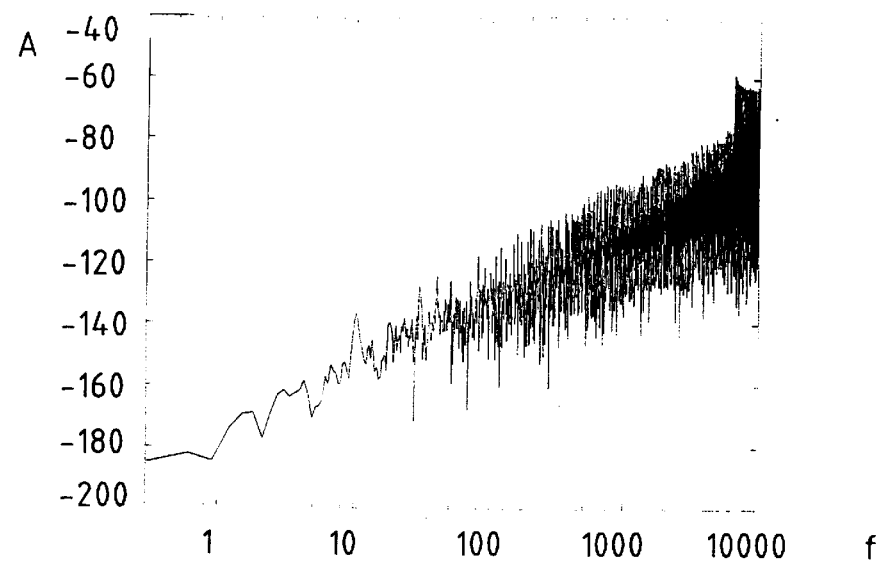
FIG. 8 shows a graph in frequency of the converter error of FIG. 6 in presence of the signal.
Figure 9:
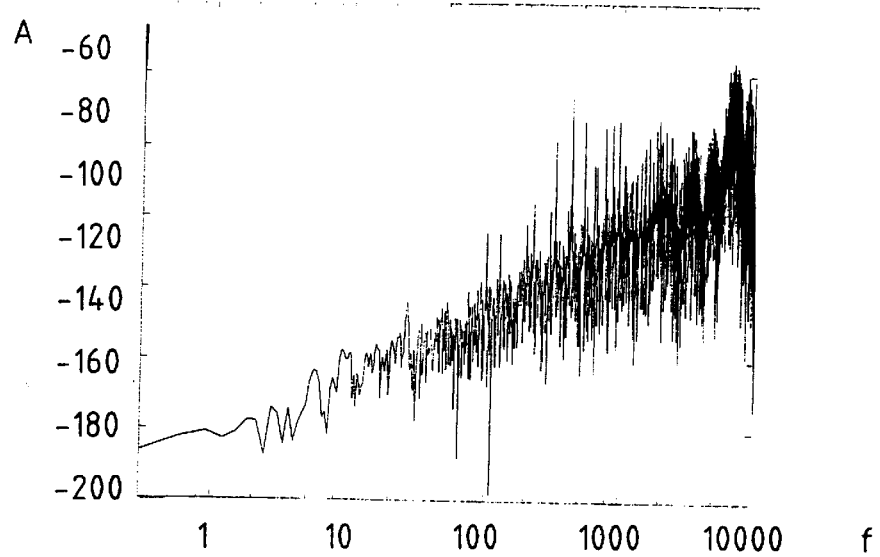
FIG. 9 shows an error frequency graph of the converter of FIG. 6 in absence of the signal.
Figure 12:
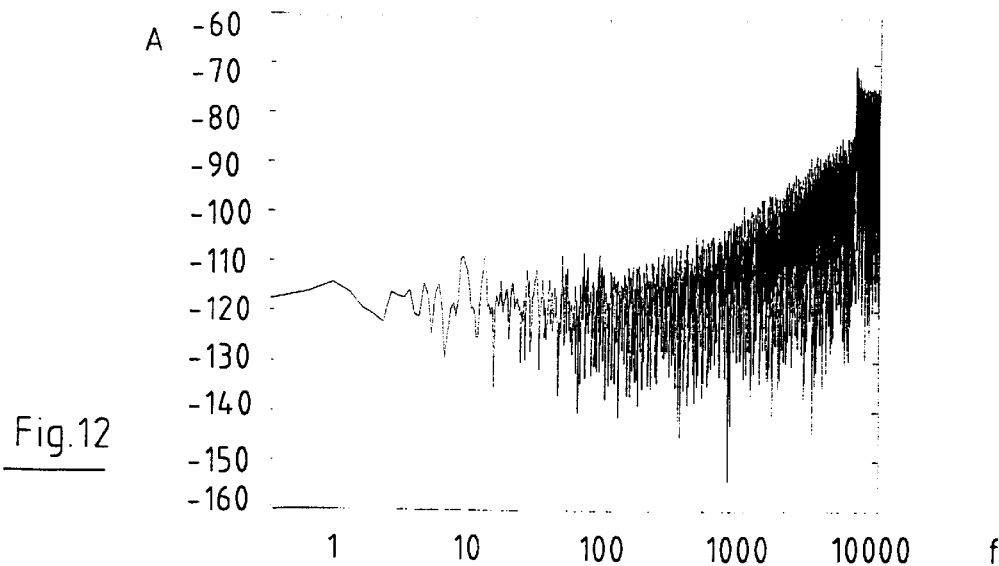
FIG. 12 shows a graph in frequency of the converter error of FIG. 10 in presence of the signal.
Figure 13:
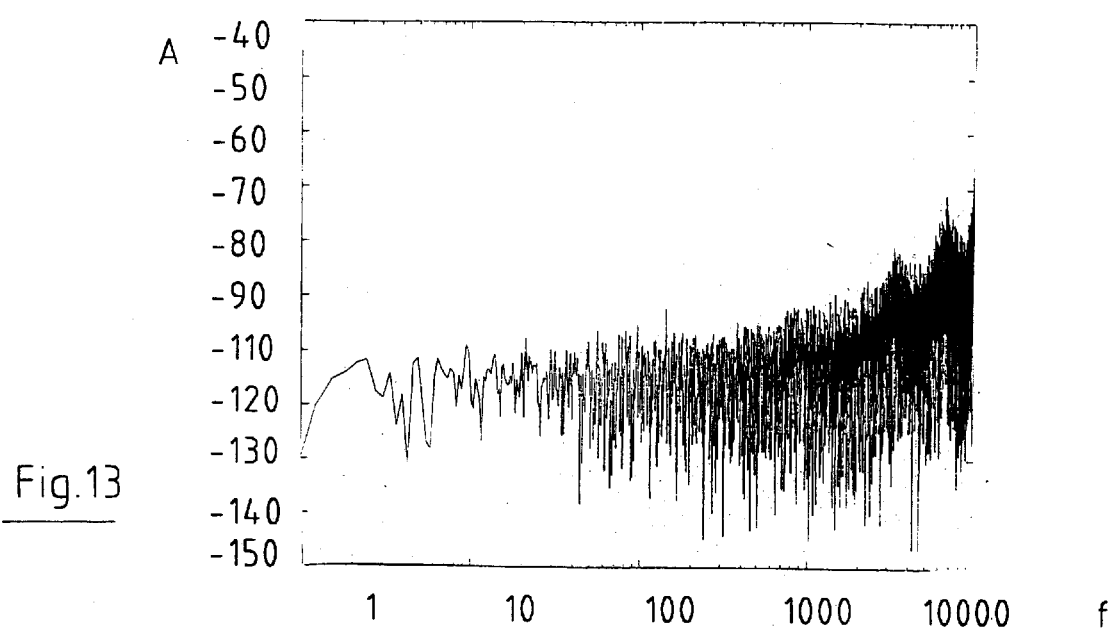
FIG. 13 shows a graph in frequency of the converter error of FIG. 10 in absence of the signal.

In fact it can be seen in FIG. 12 the result of an analogous simulation to that shown in FIG. 8, (sinusoid at 20 Hz and amplitude −10 dB), but with a control circuit like that of FIG. 10, in accordance to the present invention, and in FIG. 13 another analogous simulation to that shown in FIG. 9, (sinusoid at 20 Hz and amplitude −90 dB), always with a control circuit like that of FIG. 10.

The random number generator 91 preferably generates two values 0 and 1, but other values can be generated. In the example here described, the probability that the value 1 is generated is prefixed. Starting from the capacitor tolerances which can be expected from a particular building process of the integrated circuit, and effecting simulations of the D/A converter 21, it is determined the occurrence probability of the value 1 able to get a signal to noise ratio desired in a prefixed band and preferably flat. The occurrence probability of the value 1 is normally smaller than $1/10$, and it is preferably smaller than $1/100$.

For instance for a D/A converter 21 with 3 bit and that is 8 levels (7 capacitors), with an audio signal of band B=20 kHz, a sampling frequency fcm=44 kHz at least, an oversampling equal to 128, and a capacitor tolerance having a probability with a σ=1%, to get a signal to noise ratio of 90 dB the occurrence probability of the value 1 is equal to $1/4096$.

What is claimed is:

1. Digital to analog conversion circuit able to transform a digital input signal having n bit in an output analog signal comprising:
    a thermometric decoder having said digital input signal in input and able to produce said signal having a thermometric code with $2^n-1$ bit in output;
    a digital to analog converter with modular elements including $2^n-1$ controlled switches;
    a shift register able to receive said digital signal having $2^n-1$ bit in a data input and able to produce $2^n-1$ control signals of said controlled switches in output;
    a delay circuit of said of digital input signal having the output connected to a shift input of said shift register and able to produce a delayed digital signal in output as to make said digital signal having $2^n-1$ bit shift by a number of bit equal to the value of said delayed digital signal;
    characterised by further comprising
    a generator of a digital random number selected in a range of prefixed values and having a prefixed probability of occurrence;
    an adder node able to receive said random digital number and said delayed digital signal in input whose output is connected to said shift input of said shift register.

2. Digital to analog conversion circuit in accordance to claim 1 characterised in that said range of said digital random number comprises the values 0 and 1.

3. Circuit of digital to analog conversion in accordance to claim 2 characterised in that said occurrence probability of the value 1 is lower than $1/10$, and it is preferably lower than $1/100$.

4. Digital to analog conversion circuit in accordance to claim 1 characterised in that said modular elements comprise capacitors.

5. Digital to analog conversion circuit in accordance to claim 1 characterised in that said modular elements comprise resistances.

6. Digital to analog conversion circuit in accordance to claim 1 characterised in that a terminal of each of said modular elements is connected in series to controlled switches able to selectively connect said modular elements to a first prefixed bias voltage or to a second prefixed bias voltage, the other terminal of each of said modular elements is connected to an inverting input of an operational amplifier, a non-inverting input of said operational amplifier is connected to ground and between the output and the non-inverting input is connected a modular element.

7. Digital to analog conversion circuit in accordance to claim 1 characterised in that said delay circuit delays said digital input signal of n bit.

8. Digital to analog conversion circuit in accordance to claim 1 characterised in that said digital input signal having n bit is constituted by a parallel signal with one bit on n lines.

9. Digital to analog converter comprising a sigma delta modulator and a digital to analog conversion circuit according to the claim 1.

10. Digital to analog conversion method able to transform a digital input signal having words of n bit in an analog output signal comprising the following phases:
    transforming said input words in words having a thermometric code;
    applying said words having a thermometric code to a shift register;
    providing the words coming from said shift register to a digital to analog converter with modular elements;
    making the words contained in said shift register shift by a value equal to the preceding word;
    characterised by comprising the phase of
    making the words contained in said shift register shift by a further prefixed value on times with a prefixed probability.

11. Digital to analog conversion method of a digital input signal having a thermometric code in an analog signal, said input signal is constituted by a first digital word and by a second digital word in succession to said first digital word, comprising the following phases:
    adding said first and said second digital word;
    applying said sum as input signal of a digital to analog converter with modular elements;
    characterised in that the phase of adding said first and said second digital word comprises the phase also of adding a random digital number selected in a prefixed range of values and having a prefixed occurrence probability.

\* \* \* \* \*

UNITED STATES PATENT AND TRADEMARK OFFICE
CERTIFICATE OF CORRECTION

PATENT NO. : 6,380,878 B1
DATED : April 30, 2002
INVENTOR(S) : Carlo Pinna

It is certified that error appears in the above-identified patent and that said Letters Patent is hereby corrected as shown below:

<u>Title page,</u>
Item [73], Assignee: should read -- STMicroelectronics s.r.l. Agrate Brianza, (IT) --

Signed and Sealed this

Twenty-second Day of October, 2002

Attest:

Attesting Officer

JAMES E. ROGAN
*Director of the United States Patent and Trademark Office*